(12) United States Patent
Krieger et al.

(10) Patent No.: US 6,806,526 B2
(45) Date of Patent: Oct. 19, 2004

(54) MEMORY DEVICE

(75) Inventors: Juri H. Krieger, Brookline, MA (US); Nikolai Yudanov, Brookline, MA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 10/304,863

(22) Filed: Nov. 27, 2002

(65) Prior Publication Data

US 2004/0026729 A9 Feb. 12, 2004

Related U.S. Application Data

(63) Continuation-in-part of application No. 10/238,880, filed on Sep. 11, 2002, and a continuation-in-part of application No. PCT/RU01/00334, filed on Aug. 13, 2001.

(51) Int. Cl.[7] .................. H01L 27/108; H01L 29/76; H01L 29/94; H01L 31/119
(52) U.S. Cl. ........................... 257/296; 257/68
(58) Field of Search ................. 257/296, 288, 257/306, 906, 907, 908, 68, 365, 366, 441, 314–326; 458/3, 149, 153, 238, 381, 400, 680, 681, 687

(56) References Cited

U.S. PATENT DOCUMENTS

| | | | |
|---|---|---|---|
| 3,719,933 A | 3/1973 | Wakabayashi et al. | |
| 3,810,127 A | 5/1974 | Hoff, Jr. | |
| 4,146,876 A | * 3/1979 | Arellano et al. | ............ 345/105 |
| 4,267,558 A | 5/1981 | Guterman | |
| 4,267,583 A | 5/1981 | Suzuki | |
| 4,371,883 A | 2/1983 | Potember et al. | |
| 4,616,340 A | 10/1986 | Hayashi et al. | |
| 4,631,562 A | 12/1986 | Avery | |
| 4,652,894 A | 3/1987 | Potember et al. | |
| 4,677,742 A | 7/1987 | Johnson | |
| 4,727,514 A | 2/1988 | Bhuva et al. | |
| 4,733,375 A | 3/1988 | Terashima | |
| 4,834,911 A | 5/1989 | Carew | |
| 4,839,700 A | 6/1989 | Ramesham et al. | |
| 4,860,254 A | 8/1989 | Pott et al. | |
| 5,012,445 A | 4/1991 | Kazuaki et al. | |
| 5,034,192 A | 7/1991 | Wrighton et al. | |
| 5,130,380 A | 7/1992 | Carew | |
| 5,136,212 A | 8/1992 | Eguchi et al. | |
| 5,153,681 A | 10/1992 | Kishimoto et al. | |

(List continued on next page.)

FOREIGN PATENT DOCUMENTS

| | | |
|---|---|---|
| DE | 196 40 239 A1 | 4/1998 |
| DE | 199 59 904 A1 | 6/2001 |
| EP | 0 268 370 A3 | 5/1988 |
| EP | 0 385 688 A2 | 9/1990 |
| EP | 0 727 822 A2 | 8/1996 |
| JP | 1-103137 | 4/1989 |

(List continued on next page.)

OTHER PUBLICATIONS

Stanford R. Ovshinsky, "Localized States in the Gap of Amorphous Semiconductors", Physical Review Letters, Jun. 14, 1976, pp. 1469–1472.

Yu G. Kriger et al., "Study of Test Structures of a Molecular Memory Element", Zhurnal Strukturmoi Khimii, vol. 34, No. 6, pp. 152–156.

(List continued on next page.)

*Primary Examiner*—David Nhu
(74) *Attorney, Agent, or Firm*—Amin & Turocy, LLP

(57) ABSTRACT

A memory storage and retrieval device containing (a) an electrically conductive first electrode; (b) an electrically conductive second electrode; and (c) a layer stack intermediate the first and second electrodes containing (d) at least one active layer containing at least one polymer with variable electrical conductivity; and (e) at least one passive layer comprised of a material for varying the electrical conductivity of the at least one active layer upon application of an electrical potential difference between the first and second electrodes.

20 Claims, 5 Drawing Sheets

U.S. PATENT DOCUMENTS

| | | |
|---|---|---|
| 5,196,912 A | 3/1993 | Matsumoto et al. |
| 5,206,525 A | 4/1993 | Yamamoto et al. |
| 5,245,543 A | 9/1993 | Smayling et al. |
| 5,296,716 A | 3/1994 | Ovshinsky et al. |
| 5,315,131 A | 5/1994 | Kishimoto et al. |
| 5,319,564 A | 6/1994 | Smayling et al. |
| 5,355,235 A | 10/1994 | Nishizawa et al. |
| 5,392,236 A | 2/1995 | Hashimoto |
| 5,412,614 A | 5/1995 | Bird |
| RE34,974 E | 6/1995 | Terashima |
| 5,431,883 A | 7/1995 | Barraud |
| 5,440,518 A | 8/1995 | Hazani |
| 5,563,081 A | 10/1996 | Ozawa |
| 5,572,472 A | 11/1996 | Kearney et al. |
| 5,579,199 A | 11/1996 | Kawamura et al. |
| 5,670,818 A | 9/1997 | Forouhi et al. |
| 5,691,935 A | 11/1997 | Douglass |
| 5,698,874 A | 12/1997 | Hayashi |
| 5,734,605 A | 3/1998 | Zhu et al. |
| 5,761,115 A | 6/1998 | Kozicki et al. |
| 5,761,116 A * | 6/1998 | Li et al. ............... 365/185.1 |
| 5,770,885 A | 6/1998 | McCollum et al. |
| 5,818,749 A | 10/1998 | Harshfield |
| 5,849,403 A | 12/1998 | Aoki et al. |
| 5,869,882 A | 2/1999 | Chen et al. |
| 5,896,312 A | 4/1999 | Kozicki et al. |
| 5,900,662 A | 5/1999 | Frisina et al. |
| 5,914,893 A | 6/1999 | Kozicki et al. |
| 6,055,180 A * | 4/2000 | Gudesen et al. ........... 365/175 |
| 6,060,338 A | 5/2000 | Tanaka et al. |
| 6,064,589 A | 5/2000 | Walker |
| 6,088,319 A | 7/2000 | Gudesen |
| 6,118,684 A | 9/2000 | Yihong et al. |
| 6,128,214 A | 10/2000 | Kuekes et al. |
| 6,150,705 A | 11/2000 | Chen |
| 6,288,697 B1 | 9/2001 | Eto et al. |
| 6,292,396 B1 | 9/2001 | Tailliet |
| 6,326,936 B1 | 12/2001 | Inganas et al. |
| 6,349,054 B1 | 2/2002 | Hidaka |
| 6,353,559 B2 | 3/2002 | Hasegawa et al. |
| 6,384,427 B1 | 5/2002 | Yamazaki et al. |
| 6,388,293 B1 * | 5/2002 | Ogura et al. ............... 257/365 |
| 6,403,396 B1 | 6/2002 | Gudesen et al. |
| 6,403,397 B1 | 6/2002 | Katz |
| 6,407,953 B1 | 6/2002 | Cleeves |
| 6,418,049 B1 | 7/2002 | Kozicki et al. |
| 6,424,553 B2 | 7/2002 | Berggren et al. |
| 6,426,891 B1 | 7/2002 | Katori |
| 6,429,457 B1 | 8/2002 | Berggren et al. |
| 6,432,739 B1 | 8/2002 | Gudesen et al. |
| 6,449,184 B2 | 9/2002 | Kato et al. |
| 6,459,095 B1 | 10/2002 | Heath et al. |
| 6,461,916 B1 | 10/2002 | Adachi et al. |
| 6,487,106 B1 | 11/2002 | Kozicki |
| 6,498,583 B1 * | 12/2002 | Tsai et al. ................ 342/169 |
| 6,627,944 B2 * | 9/2003 | Mandell et al. ........... 257/315 |
| 2001/0014038 A1 | 8/2001 | Hasegawa et al. |
| 2001/0054709 A1 | 12/2001 | Heath et al. |
| 2001/0055384 A1 | 12/2001 | Yamazaki et al. |
| 2002/0027819 A1 | 3/2002 | Tomanek et al. |
| 2002/0101763 A1 | 8/2002 | Hosogane et al. |
| 2002/0104889 A1 | 8/2002 | Forrest et al. |
| 2002/0125504 A1 | 9/2002 | Perlov et al. |
| 2002/0134979 A1 | 9/2002 | Yamazaki et al. |
| 2002/0163030 A1 | 11/2002 | Mandell et al. |
| 2002/0163057 A1 | 11/2002 | Bulovic et al. |
| 2002/0163828 A1 | 11/2002 | Krieger et al. |
| 2002/0163829 A1 | 11/2002 | Bulovic et al. |
| 2002/0163830 A1 | 11/2002 | Bulovic et al. |
| 2002/0163831 A1 | 11/2002 | Krieger et al. |
| 2002/0168820 A1 | 11/2002 | Kozicki et al. |

FOREIGN PATENT DOCUMENTS

| | | |
|---|---|---|
| JP | 7-106440 | 4/1995 |
| RU | 2071126 C1 | 12/1996 |
| RU | 2071126 | 12/1996 |
| WO | WO 93/04506 A1 | 3/1993 |
| WO | WO 99/04440 A1 | 1/1999 |
| WO | WO 99/08325 A2 | 2/1999 |
| WO | WO 99/14762 A1 | 3/1999 |
| WO | WO 99/19900 A2 | 4/1999 |
| WO | WO 00/26918 A1 | 5/2000 |
| WO | WO 00/48196 A1 | 8/2000 |
| WO | WO 02/35580 A2 | 5/2002 |
| WO | WO 02/37500 A1 | 5/2002 |
| WO | WO 02/43071 A1 | 5/2002 |
| WO | WO 02/078003 A2 | 10/2002 |
| WO | WO 02/091384 A1 | 11/2002 |
| WO | WO 02/091385 A1 | 11/2002 |
| WO | WO 02/091476 A1 | 11/2002 |
| WO | WO 02/091494 A1 | 11/2002 |
| WO | WO 02/091495 A2 | 11/2002 |
| WO | WO 02/091496 A2 | 11/2002 |
| WO | WO 03/017282 A1 | 2/2003 |

OTHER PUBLICATIONS

Yu G. Krieger, "Molecular Electronics: Current State and Future Trends", Journal of Structural Chemistry, vol. 34, No. 6, 1993, pp. 896–904.

Yu H. Krieger, "Structural Instability of One–Dimensional Systems as a Physical Principle Underlying the Functioning of Molecular Electronic Devices", Zhurnal Strukturmoi Khimii, vol. 40, No. 4, pp. 734–767.

Ju H. Krieger et al., "Molecular analogue memory cell based on electrical switching and memory in molecular thin films", Synthetic Metals 7730 (2000), pp. 1–4.

R.S. Potember et al., "Electrical switching and memory phenomena in Cu–TCNQ thin films", Appl. Phys. Lett. 34(6), Mar. 15, 1979, pp. 405–407.

Yasuhiko Machida et al., "Electrical Switching in Evaporated Lead Phthalocyanine Films", Japanese Journal of Applied Physics, vol. 28, No. 2, Feb. 1989, pp. 297–298.

A. Beck et al., "Reproducible switching effect in thin oxide films for memory applications", Applied Physics Letters, vol. 77, No. 1, Jul. 3, 2000, pp. 139–141.

C. Rossel et al., "Electrical current distribution across a metal–insulator–metal structure during bistable switching", IBM Research, pp. 1–8.

"A Disrupted Organic Film: Could Memories Be Made of This?," ORNL Review, vol. 33, No. 2, 2000.

"Technical Summary of Programmable Metallization Cell Memory Technology," Version 1.3, Dec. 2001.

"The 1998 Conference Archive," The Sixth Foresight Conference on Molecular Nanotechnology, Nov. 12–15, 1998, www.foresight.org/Conferences/MNT6/index.html.

Beck, A. et al., "Reproducible Switching Effect in Thin Oxide Films for Memory Applications," Applied Physics Letters, vol. 77, No. 1, pp. 139–141, Jul. 3, 2000.

Bernard, Allen, "A Big Name in Chips Helps Coatue in Molecular Memory Race," Aug. 27, 2000, www.nanoelectronicsplanet.com/features/article/0,4028,6571–1452831,00.html.

Chen, J. et al., "Room–temperature Negative Differential Resistance in Nanoscale Molecular Junctions," Applied Physics Letters, vol. 77, No. 8, Aug. 21, 2000.

Collier, C. P. et al., "Electrically Configurable Molecular–Based Logic Gates," *Science*, vol. 285, pp. 391–394, Jul. 16, 1999.

Gannon, Andrew, "Toward the Next Generation CD," *Physical Review Focus*, Feb. 16, 2000.

Gao, H. .J. et al., "Reversible, Nanometer–Scale Conductance Transitions in an Organic Complex," *Physical Review Letters*, vol. 84, No. 8, pp. 1780–1783, Feb. 21, 2000.

Gao, H. .J. et al., "Using a New Kind of Organic Complex System of Electrical Bistability for Ultrahigh Density Data Storage," *J. Vac. Sci. Technol. B* vol. 15, No. 4, pp. 1581–1583, Jul./Aug. 1997.

International Search Report, PCT/RU01/00334, search completed Feb. 14, 2002.

International Search Report, PCT/US02/14236, search completed Aug. 14, 2002.

International Search Report, PCT/US02/14237, search completed Sep. 9, 2002.

International Search Report, PCT/US02/14238, search completed Aug. 9, 2002.

International Search Report, PCT/US02/14239, search completed Aug. 20, 2002.

International Search Report, PCT/US02/14269, search completed Mar. 27, 2003.

International Search Report, PCT/US02/14270, search completed Mar. 28, 2003.

Japanese patent abstract of publication No. 01–103137, Apr. 20, 1989.

Japanese patent abstract of publication No. 01278781, Nov. 9, 1989.

Japanese patent abstract of publication No. 61107723, May 26, 1986.

Japanese patent abstract of publication No. 63293729, Nov. 30, 1998.

Krieger, Ju. H. et al., "Molecular Analogue Memory Cell Based on Electrical Switching and Memory in Molecular Thin Films," *Synthetic Metals*, 7730 (2000), pp. 1–4.

Krieger, Juri H. et al., "Molecular Analogue Memory Cell," *Sixth Foresight Conference on Molecular Nanotechnology*, Santa Clara, California, Nov. 12–15, 1998.

Krieger, Yu. G. et al., "Study of Test Structures of a Molecular Memory Element," *Institute of Inorganic Chemistry*, Siberian Branch, Russian Academy of Sciences. Translated from *Zhumal Strukturnoi Khimii*, vol. 34, No. 6, pp. 152–156, Nov.–Dec. 1993. Orginal article submitted Apr. 27, 1993.

Krieger, Yu. G., "Molecular Electronics: Current State and Future Trends," *Journal of Structural Chemistry*, vol. 34, No. 6, pp. 896–904, Nov.–Dec. 1993.

Krieger, Yu. H., "Structural Instability of One–Dimensional Systems as a Physical Principle Underlying the Functioning of Molecular Electronic Devices," *Journal of Structural Chemistry*, vol. 40, No. 4, pp. 594–619, Jul.–Aug. 1999.

Kurita, Ryo et al., "Field Modulation Effects on Charge–Density–Wave Conduction in $NbSe_3$," *Physica B*, 284–288 (2000), pp. 1161–1662.

Ma, L. P. et al., "Data Storage With 0.7 nm Recording Marks on a Crystalline Organic Thin Film by a Scanning Tunneling Microscope," *Applied Physics Letters*, vol. 73, No. 6, pp. 850–852, Aug. 10, 1998.

Ma, L.P. et al., "Nanometer–Scale Recording on an Organic Complex Thin Film With a Scanning Tunneling Microscope," *Applied Physics Letters*, vol. 69, No. 24, pp. 3752–3753, Dec. 9, 1996.

Machida, Yasuhiko et al., "Electrical Switching in Evaporated Lead Phthalocyanine Films," *Japanese Journal of Applied Physics*, vol. 28, No. 2, pp. 297–298, Feb. 1989.

Ovshinsky, Stanford R., "Localized States in the Gap of Amorphous Semiconductors," *Physical Review Letters*, vol. 36, No. 24, pp. 1469–1472, Jun. 14, 1976.

Potember, R. S. et al., "Electrical Switching and Memory Phenomena in Cu–TCNQ Thin Films," *Applied Physics Letters*, vol. 34, No. 6, pp. 405–407, Mar. 15, 1979.

Reed, M.A. et al., "Molecular Random Access Memory Cell," *Applied Physics Letters*, vol. 78, No. 23, pp. 3735–3737, Jun. 4, 2001.

Rossel, C. et al., "Electrical Current Distribution Across a Metal–Insulator–Metal Structure During Bistable Switching," Apr. 24, 2001.

Rotman, David, "Molecular Memory," *Technology Review*, May 2001.

*Semiconductor Times*, pp. 5–6, Jul. 2002.

Stikeman, Alexandra, "Polymer Memory: The Plastic Path to Better Data Storage," *Technology Review*, p. 31, Sep. 2002.

Zhou, C. et al., "Nanoscale Metal/Self–Assembled Monolayer/Metal Heterostructures," *Applied Physics Letters*, vol. 71, No. 5, pp. 611–613, Aug. 4, 1997.

* cited by examiner

FIG. 1(A)  Memory Cell in the "Off" State
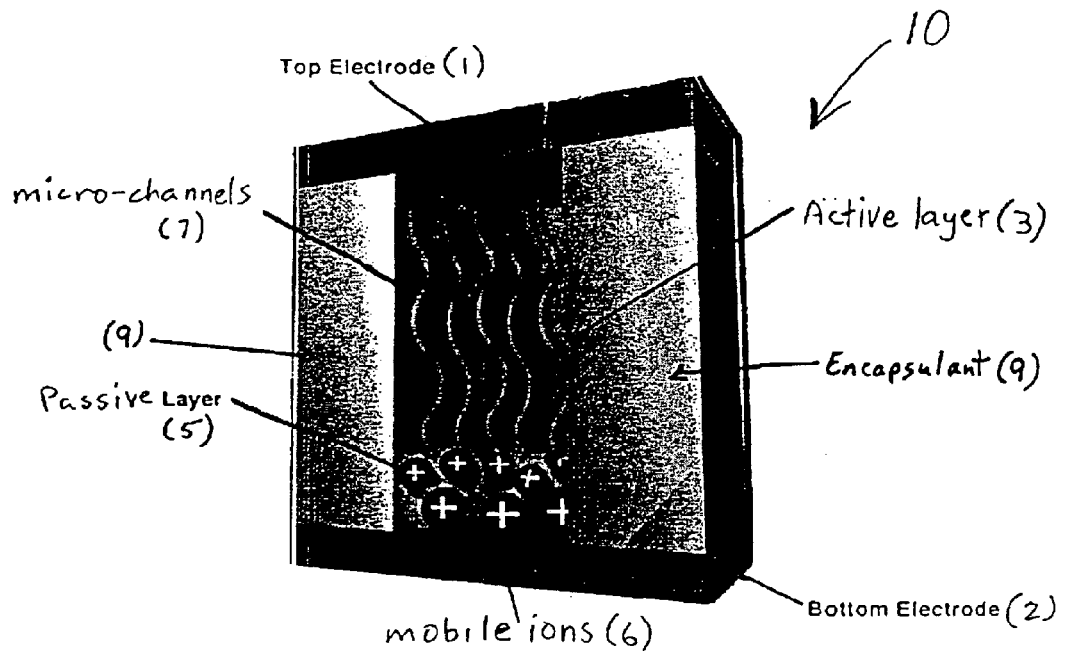
FIG. 1(B)  Memory Cell in the "On" State
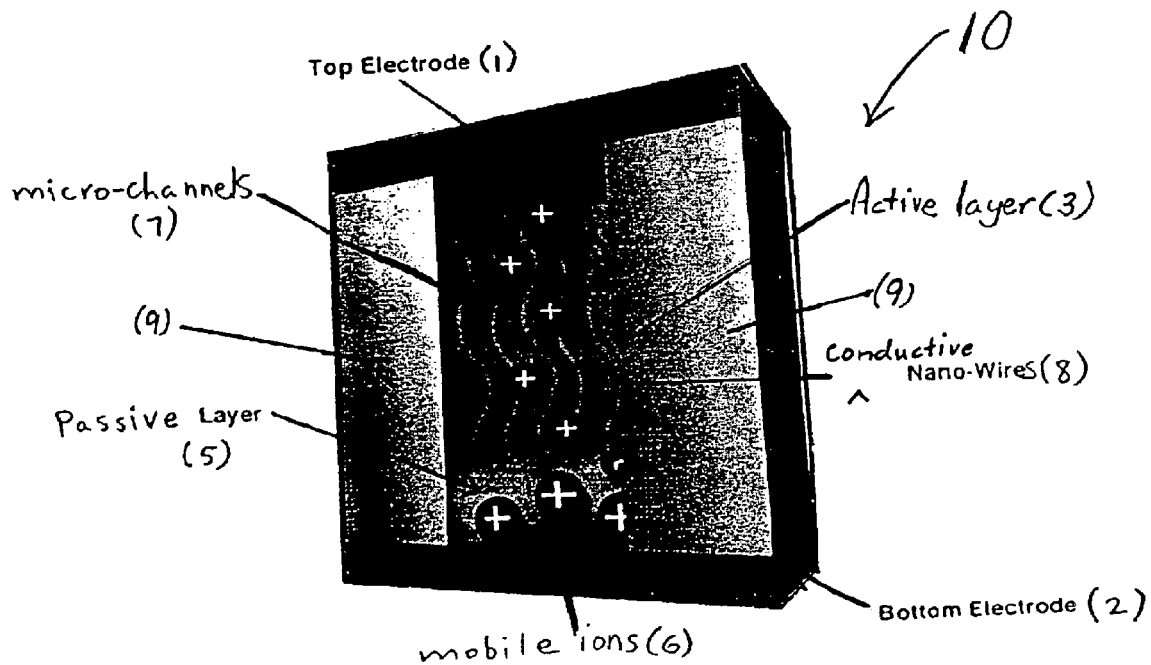

MEMORY DEVICE

CROSS-REFERENCE TO RELATED APPLICATION

This application is a Continuation-in-Part of PCT application PCT/RU01/00334 filed Aug. 13, 2001 and is a continuation-in-part of 10/238,880 filed Sep. 11, 2002.

RELATED APPLICATIONS

This application contains subject matter related to the subject matter disclosed in copending U.S. patent application Ser. No. 10/238,880, filed on Sep. 11, 2002, entitled "Memory Device".

FIELD OF THE INVENTION

The present invention relates to novel memory devices. The invention is useful in the development, manufacture, and use of a variety of devices and/or technologies, including, inter alia, memory devices for electronic computers, associative memory systems, circuit elements with programmable resistance for creating synapses for neuronal nets, direct access data banks, and new types of video/audio equipment.

BACKGROUND OF THE INVENTION

Modern electronic computers employ several different types of memory devices for various purposes and functions requiring different performance/operating characteristics, e.g., read/write and storage/retrieval speeds. The multiplicity of different requirements for the various memory devices substantially complicates the operation of computer systems, increases start-up times, and complicates data storage.

As a consequence of the above-mentioned drawbacks and disadvantages associated with current memory device technology, a high priority task of the microelectronics industry is creation/development of a universal memory device/system having high read/write speeds, high storage density, and long term data retention characteristics.

A number of electronic memory or switching devices have been proposed or developed which include a bi-stable element that can be controllably alternated between high impedance and low impedance states by application of an electrical input, e.g., a voltage equal to or greater than a threshold voltage. Memory and switching devices utilizing such threshold-type behavior have been demonstrated with both organic and inorganic thin film semiconductor materials, including amorphous silicon, chalcogenides such as arsenic trisulphide-silver ($As_2S_3$—Ag), organic materials, and heterostructures such as $SrZrO_3$(0.2% Cr)/$SrRuO_3$. See, for example: U.S. Pat. Nos. 5,761,115; 5,896,312; 5,914,893; 5,670,818; 5,770,885; and 6,150,705; U.S. Patent Application Publication No. 2001/0054709, Russian Patent No. 2,071,126; S. R. Ovshinsky, Phys. Rev. Lett., 36, 1469 (1976); J. H. Krieger, et al., J. Struct. Chem., 34, 966 (1993); J. H. Krieger, et al., Synthetic Metals, 122, 199 (2001); R. S. Potember, et al., Appl. Phys. Lett., 34 (6), 405 (1979); Y. Machida, et al., Jap. J. Appl. Phys., Part 1, 28 (2), 297 (1989); A. Beck, et al., Appl. Phys. Lett., 77, 139 (2000); and C. Rossel et al., J. Appl. Phys. (2001), in press.

U.S. Pat. No. 6,055,180 to Gudeson, et al. discloses an electrically addressable, passive storage device for registration, storage, and/or processing of data, comprising a functional medium in the form of a continuous or patterned structure capable of undergoing a physical or chemical change of state. The functional medium comprises individually addressable cells each of which represents a registered or detected value or is assigned a predetermined logical value. Each cell is sandwiched between an anode and cathode (electrode means) which contact the functional medium of the cell for electrical coupling therethrough, with the functional medium having a non-linear impedance characteristic, whereby the cell can be directly supplied with energy for effecting a change in the physical or chemical state in the cell.

A disadvantage/drawback of the storage device of U.S. Pat. No. 6,055,180, however, is that writing of information can occur only once, and reading of the stored information is performed optically, thereby increasing the size and complexity of the device and its use, at the same time reducing reliability of reading of the information due to the difficulty in accurately positioning the optical beam. In addition, an alternate writing method utilizing thermal breakdown caused by application of a high voltage is also disadvantageous in that writing of information can only occur once, and high voltages, hence high electrical fields, are required.

JP 62-260401 discloses a memory cell with a three-layer structure comprised of a pair of electrodes with a high temperature compound (i.e., molecule) sandwiched therebetween, which memory cell operates on a principle relying upon a change of electrical resistance of the compound upon application of an external electric field. Since the conductivity of the compound can be controllably altered between two very different levels, information in bit form can be stored therein.

U.S. Pat. No. 5,761,116 to Kozicki et al. discloses a "programmable metallization cell" comprised of a "fast ion conductor", such as a film or layer of a chalcogenide doped with a metal ion, e.g., silver or copper, and a pair of electrodes, i.e., an anode (e.g., of silver) and a cathode (e.g., of aluminum), spaced apart at a set distance on the surface of the doped chalcogenide. The silver or copper ions can be caused to move through the chalcogenide film or layer under the influence of an electric field. Thus, when a voltage is applied between the anode and the cathode, a non-volatile metal dendrite ("nano-wire") grows on the surface of the chalcogenide film or layer ("fast ion conductor") from the cathode to the anode, significantly reducing the electrical resistance between the anode and cathode. The growth rate of the dendrite is a function of the applied voltage and the interval of its application. Dendrite growth may be terminated by removing the applied voltage and the dendrite may be retracted towards the cathode by reversing the polarity of the applied voltage.

U.S. Pat. No. 5,670,818 to Forouhi et al. discloses a read-only memory device in the form of an electrically programmable antifuse comprised of a layer of amorphous silicon between metal conductors. Under application of a high voltage, a portion of the amorphous silicon layer undergoes a phase change and atoms from the metal conductors migrate into the silicon layer, resulting in formation of a thin conducting filament ("nano-wire") composed of a complex mixture of silicon and metal.

The principal shortcomings of the above-described memory devices relying upon nano-wire formation are related to the low operational speeds caused by the extended interval required for effecting substantial change in the electrical resistance between the electrodes/conductors and to the high voltage required, e.g., ~60 V. Such drawbacks significantly limit practical use of the cells in current high speed electronic devices.

U.S. Pat. No. 4,652,894 to Potember et al. discloses a current-controlled, bi-stable threshold or memory switch, comprised of a layer of a polycrystalline metal-organic semiconductor material sandwiched between a pair of metallic electrodes, wherein the layer of metal-organic semiconductor material is an electron acceptor for providing fast switching at low voltages between high and low impedance states.

Practical implementation of the threshold memory switch of U.S. Pat. No. 4,652,894 is limited, however, principally due to the use of low temperature metal-organic semiconductor compounds which are not sufficiently mechanically robust, and more importantly, are insufficiently resistant to chemical degradation when subjected to the elevated temperatures commonly associated with modern semiconductor manufacturing processing, i.e., greater than about 150° C. and as high as about 400° C. In addition, the physical characteristics of the metal-organic semiconductor materials cause poor repeatability of the read/write/erase cycle, and storage is limited to only 1 bit of formation, thereby prohibiting use in high information density applications/devices.

U.S. Patent Application Publication No. 2001/0054709 to Heath et al. discloses the fabrication of electronic devices comprised of two crossed nanowires sandwiching an electrically addressable molecular species. The devices are used to produce crossbar switch arrays, logic devices, memory devices and communication and signal routing devices.

In view of the above, there exists a clear need for memory devices which are free of the above-described shortcomings, drawbacks, and disadvantages associated with memory devices of the conventional art. The present invention, therefore, has as its principal aim the development of a universal memory device/system for high speed data storage and retrieval, with capability of long term storage at high bit densities.

DISCLOSURE OF THE INVENTION

An advantage of the present invention is an improved memory storage and retrieval device.

Another advantage of the present invention is an improved memory storage and retrieval device not requiring formation of conventional semiconductor junctions.

Yet another advantage of the present invention is an improved memory storage and retrieval device which can be readily fabricated from a variety of materials.

Still another advantage of the present invention is an improved memory storage and retrieval device having very high read and write speeds, long term data retention, and high data storage density.

Additional advantages and other features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to an aspect of the present invention, the foregoing and other advantages are obtained in part by a memory storage and retrieval device, comprising:

(a) an electrically conductive first electrode;
(b) an electrically conductive second electrode; and
(c) a layer stack intermediate the first and second electrodes, the layer stack comprising:
  (d) at least one active layer comprising a polymer material with variable electrical conductivity; and
  (e) at least one passive layer comprised of a material for varying the electrical conductivity of the at least one active layer upon application of an electrical potential difference between the first and second electrodes.

In accordance with embodiments of the present invention, the electrical conductivity of the at least one active layer is reversibly varied upon introduction and removal of charged species; and the at least one passive layer is comprised of a material for reversibly donating the charged species to and accepting the charged species from the active layer.

According to preferred embodiments of the invention, the charged species comprise ions or a combination of ions and electrons, the ions selected from the group consisting of: metal ions, metal-containing ions, non-metal ions, and non-metal-containing ions.

Embodiments of the present invention include those wherein the layer stack comprises a pair of active layers in mutual contact; and the layer stack may further comprise:

(f) at least one barrier layer comprised of a material which impedes spontaneous movement of the charged species when the electrical potential difference is not applied between the first and second electrodes.

Further embodiments of the present invention include those wherein the at least one barrier layer is positioned within the stack intermediate the active layer and the passive layer; embodiments wherein the layer stack comprises first and second active layers and the at least one barrier layer is positioned within the stack intermediate the first and second active layers; and embodiments wherein the layer stack comprises first and second passive layers in respective contact with the first and second electrically conductive electrodes.

According to still further embodiments of the present invention, the at least one active layer and the at least one passive layer are each comprised of the same material, whereby the stack effectively comprises a single layer. The single layer comprises a composite material comprising a porous dielectric containing at least one polymer with variable conductivity, and the porous dielectric is selected from the group consisting of Si, amorphous Si, silicon dioxide ($SiO_2$), aluminum oxide ($Al_2O_3$), copper oxide ($Cu_2O$), titanium dioxide ($TiO_2$), boron nitride (BN), vanadium oxide ($V_2O_3$), carbon tri-nitride ($CN_3$), and ferroelectric materials, including barium-strontium titanate (($Ba,Sr$)$TiO_3$).

Embodiments of the present invention include those wherein the single layer stack comprises at least one barrier layer positioned within the stack interior comprised of a material which impedes spontaneous movement of the charged species when an electrical potential difference is not applied between said first and said second electrodes.

According to still further embodiments of the present invention, the single layer comprises at least one polymer with variable conductivity and doped with a charged species or electrolyte clusters.

In accordance with embodiments of the present invention, each of the first and second electrically conductive electrodes comprises at least one electrically conductive material selected from the group consisting of metals, metal alloys, metal nitrides, oxides, sulfides, carbon, and polymers; and according to particular embodiments of the invention, each of the first and second electrically conductive electrodes comprises at least one material selected from the group consisting of aluminum (Al), silver (Ag), copper (Cu), titanium (Ti), tungsten (W), their alloys and nitrides, amorphous carbon, transparent oxides, including indium-tinoxide (ITO), transparent sulfides, and conductive organic polymers, each of the first and second electrically conductive electrodes being from about 1000 to about 8,000 Å thick, preferably about 3,000 to about 5,000 Å thick.

According to embodiments of the present invention, the at least one active layer comprises at least one material with a relatively lower intrinsic electrical conductivity when free of a charged species, and a relatively higher electrical conductivity when doped with a charged species. A suitable material for the active layer includes at least one polymer with variable electrical conductivity, which one or more polymers with variable electrical conductivity further include a plurality of channels or pores extending therethrough for facilitating movement of charged species therein.

Examples of polymers with variable electrical conductivity include polyacetylene polymers. Suitable polyacetylene polymers include those selected from the group consisting of polydiphenylacetylene, poly(t-butyl)diphenylacetylene, poly(trifluoromethyl)diphenylacetylene, polybis-trifluoromethyl)acetylene, polybis(t-butyldiphenyl) acetylene, poly(trimethylsilyl) diphenylacetylene, poly(carbazole)diphenylacetylene, polydiacetylene, polyphenylacetylene, polypyridineacetylene, polymethoxyphenylacetylene, polymethylphenylacetylene, poly(t-butyl)phenylacetylene, polynitrophenylacetylene, poly(trifluoromethyl) phenylacetylene, poly(trimethylsilyl) pheylacetylene, and derivatives of the foregoing containing ion trapping molecular groups selected from the group consisting of crown ethers, cyclic analogues of crown ethers, carboxyls, diimines, sulfonics, phosphonics and carbodithioics.

Other suitable polymers include those selected from the group consisting of polyaniline, polythiophene, polypyrrole, polysilane, polystyrene, polyfuran, polyindole, polyazulene, polyphenylene, polypyridine, polybipyridine, polyphthalocyanine, poly(ethylenedioxythiophene) and derivatives of the foregoing with ion trapping molecular groups selected from the group consisting of crown ethers, cyclic analogues of crown ethers, carboxyls, diimines, sulfonics, phosphonics and carbodithioics.

Preferred polymers are those with high thermal stability, e.g., thermally stabile at about 400° C. and higher.

It is also desirable to use a composite material comprised of a porous dielectric containing at least one polymer with variable conductivity. Examples of usable porous dielectric materials include those selected from the group consisting of Si, amorphous Si, silicon dioxide ($SiO_2$), aluminum oxide ($Al_2O_3$), copper oxide ($Cu_2O$), titanium dioxide ($TiO_2$), boron nitride (BN), vanadium oxide ($V_2O_3$), carbon trinitride ($CN_3$), and ferroelectric materials, including barium-strontium titanate (($Ba,Sr)TiO_3$).

The at least one active layer is from about 50 to about 3,000 Å thick, preferably about 500 to about 700 Å thick.

In accordance with embodiments of the present invention, the at least one passive layer comprises at least one super-ionic conductor material or intercalation compound, wherein the at least one super-ionic conductor material or intercalation compound reversibly donates and accepts charged species; e.g., ions or a combination of ions and electrons, the ions selected from the group consisting of silver (Ag), copper (Cu), gold (Au), lithium (Li), sodium (Na), potassium (K), zinc (Zn), magnesium (Mg), other metal or metal-containing ions, hydrogen (H), oxygen (O), fluorine (F), and other halogen-containing ions; and the at least one super-ionic conductor material or intercalation compound is selected from the group consisting of AgI, AgBr, $Ag_2S$, $Ag_2Se$, $Ag_{2-x}Te$, $RbAg_4I_5$, CuI, CuBr, $Cu_{2-x}S$, $Cu_{2-x}Se$, $Cu_{2-x}Te$, $Ag_xCu_{2-x}S$, $Cu_3HgI_4$, $Cu_3HgI_4$, AuI, $Au_2Au_2Se$, $Au_2S_3$, $Na_xCu_ySe_2$, $Li_3N$, $LiNiO_2$, $Li_xTiS_2$, $Li_xMoSe_2$, $Li_xTaS_2$, $Li_xVSe_2$, $Li_xHfSe_2$, $Li_xWO_3$, $Cu_xWO_3$, $Na_xWO_3$, $H_xWO_3$, $H_xPd$, $Na-Al_2O_3$, $(AgI)_x(Ag_2O_nB_2O_3)_{1-x}$, $Ag_2CdI_4$, $Cu_xPb_{1-x}Br_{2-x}$, $Li_3M_2(PO_4)_3$-where M=Fe, Sc, or Cr, $K_3Nb_3B_2O_{12}$, $K_{1-x}Ti_{1-x}Nb_xOPO_4$, $SrZr_{1-x}Yb_xO_3$, $Sr_{1-x/2}Ti_{1-x}$, $Nb_xO_3$-, $Mg_3Bi_2$, $Cs_5H_3(SO_4)_x·H_2O$, $M_3H(XO_4)_2$-where M=Rb, Cs, or $NH_4$ and X=Se or S, $NaZr_2(PO_4)_3$, $Na_{4.5}FeP_2O_8(OF)_{1-x}$, $ZrO_{2-x}$, $CeO_{2-x}$, $CaF_2$, and $BaF_2$. The passive layer is from about 20 to about 300 Å thick, preferably about 100 to about 150 Å thick.

According to embodiments of the present invention, the at least one barrier layer comprises at least one material selected from the group consisting of at least one material selected from the group consisting of $SiO_x$, $AlO_x$, $NbO_x$, $TiO_x$, $CrO_x$, $VO_x$, $TaO_x$, $CuO_x$, $MgO_x$, $WO_x$, $AlN_x$, Al, Pt, Nb, Be, Zn, Ti, W, Fe, Ni, and Pd. The barrier layer is from about 20 to about 300 Å thick, preferably about 50 Å thick.

Additional advantages and aspects of the present invention will become readily apparent to those skilled in the art from the following description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which similar reference numerals are employed throughout to designate similar features, and in which the various features are not necessarily drawn to scale but rather are drawn as to best illustrate the pertinent features, wherein:

FIGS. 1(A)–1(B), show, in schematic, partially cut-away perspective view, an example of a two-layer memory device 10 according to the invention for illustrating the principle of conductivity modulation;

DESCRIPTION OF THE INVENTION

Figure 2:
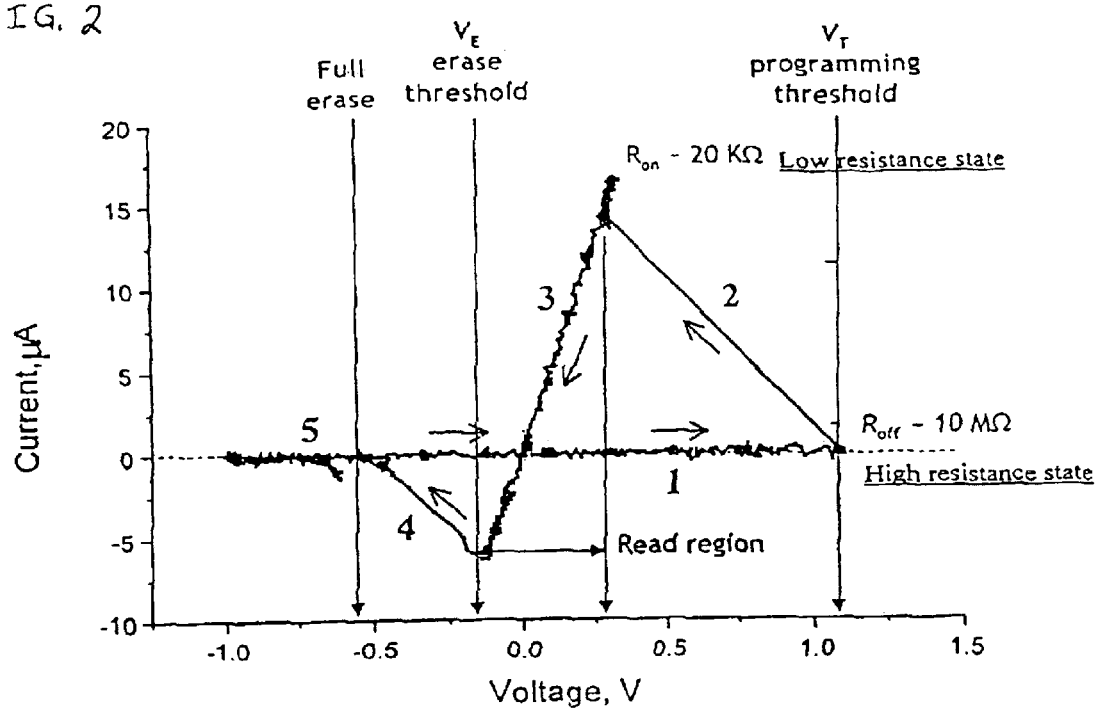
FIG. 2 is a current (I)-voltage (V) plot for illustrating operation of memory devices according to the invention.

The present invention is based upon the discovery by the inventor that: (1) polymeric materials exist, or can be prepared, which can be made to exhibit reversible change, i.e., modulation, of their electrical conductivity upon application and subsequent removal of an electrical field; and (2) useful devices, in particular memory devices, can be fabricated wherein the phenomenon of reversible conductivity change or modulation exhibited by such polymeric materials forms the basis for operation of the devices.

Specifically, there exists polymers with relatively low intrinsic electrical conductivity, which are potentially useful as an active layer of a memory device, which materials can be formed into layers exhibiting a substantial increase in conductivity (i.e., conductivity modulation) when doped with charged species of various types, for example ions or a combination of ions and electrons, which are introduced thereinto under the influence of an applied electrical field of a first polarity, and which layers reversibly exhibit a substantial decrease in electrical conductivity when the charged species are caused to be at least partially withdrawn therefrom by application of an electrical field of a second, opposite polarity. Thus, active layers according to the present invention are susceptible to conductivity modulation by means of reversible doping/withdrawal of charged species, e.g., ions or a combination of ions and electrons, under the influence of applied electric fields of appropriate polarity.

Examples of polymers with variable electrical conductivity include polyacetylene polymers characterized by conjugated unsaturated bonds which facilitate electron movement. Suitable polyacetylene polymers include those selected from the group consisting of polydiphenylacetylene, poly(t-butyl) diphenylacetylene, poly(trifluoromethyl)diphenylacetylene, polybis-(trifluoromethyl)acetylene, polybis(t-butyldiphenyl) acetylene, poly(trimethylsilyl) diphenylacetylene, poly (carbazole)diphenylacetylene, polydiacetylene, polyphenylacetylene, polypyridineacetylene, polymethoxyphenylacetylene, polymethylphenylacetylene, poly(t-butyl)phenylacetylene, polynitro-phenylacetylene, poly(trifluoromethyl) phenylacetylene, poly(trimethylsilyl) pheylacetylene, and derivatives of the foregoing with ion trapping molecular groups selected from the group consisting of crown ethers, cyclic analogues of crown ethers, carboxyls, diimines, sulfonics, phosphonics and carbodithioics.

Other suitable polymers include those selected from the group consisting of polyaniline, polythiophene, polypyrrole, polysilane, polystyrene, polyfuran, polyindole, polyazulene, polyphenylene, polypyridine, polybipyridine, polyphthalocyanine, poly(ethylenedioxythiophene) and derivatives of the foregoing with ion trapping molecular groups selected from the group consisting of crown ethers, cyclic analogues of crown ethers, carboxyls, diimines, sulfonics, phosphonics and carbodithioics.

Preferred polymers are those with high thermal stability, e.g., thermally stabile at about 400° C. and higher.

It is also desirable to use a composite material comprising a porous dielectric containing one or more polymers with variable conductivity. Examples of porous dielectric materials include those selected from the group consisting of Si, amorphous Si, silicon dioxide ($SiO_2$), aluminum oxide ($Al_2O_3$), copper oxide ($Cu_2O$), titanium dioxide ($TiO_2$), boron nitride (BN), vanadium oxide ($V_2O_3$), carbon trinitride ($CN_3$), and ferroelectric materials, including barium-strontium titanate ($(Ba,Sr)TiO_3$).

The at least one active layer is from about 50 to about 3,000 Å thick, preferably about 500 to about 700 Å thick.

A key feature of the present invention is the presence of an additional layer of material, termed a passive layer, for reversibly functioning as a source of the charged species, e.g., ions or ions+electrons, which are introduced (injected) into the active layer during application of the first polarity electrical field and as an acceptor (sink) of the charged species which are removed (withdrawn) from the active layer during application of the second, opposite polarity electrical field. According to the invention, reversible charged species donor/acceptor materials suitable for use as the passive layer include, for example, compounds with mobile ions, including super-ionic conductors and intercalation compounds, e.g., $AgI$, $AgBr$, $Ag_2S$, $Ag_2Se$, $Ag_{2-x}Te$, $RbAg_4I_5$, $CuI$, $CuBr$, $Cu_{2-x}S$, $Cu_{2-x}Se$, $Cu_{2-x}Te$, $Ag_xCu_{2-x}S$, $Cu_3HgI_4$, $Cu_3HgI_4$, $AuI$, $Au_2S$, $Au_2Se$, $Au_2S_3$, $Na_xCu_ye_2$, $Li_3N$, $LiNiO_2$, $Li_xTiS_2$, $Li_xMoSe_2$, $Li_xTaS_2$, $Li_xVSe_2$, $Li_xHfSe_2$, $Li_xWO_3$, $Cu_xWO_3$, $Na_xWO_3$, $H_xWO_3$, $H_xPd$, $Na-Al_2O_3$, $(AgI)_x(Ag_2O_nB_2O_3)_{1-x}$, $Ag_2CdI_4$, $Cu_xPb_{1-x}Br_{2-x}$, $Li_3M_2(PO_4)_3$-where M=Fe, Sc, or Cr, $K_3Nb_3B_2O_{12}$, $K_{1-x}Ti_{1-x}Nb_xOPO_4$, $SrZr_{1-x}Yb_xO_3$, $Sr_{1-x/2}Ti_{1-x}$, $Nb_xO_{3-}$, $-Mg_3Bi_2$, $Cs_5H_3(SO_4)_x·H_2O$, $M_3H(XO_4)_2$-where M=Rb, Cs, or $NH_4$ and X=Se or S, $NaZr_2(PO_4)_3$, $Na_{4.5}FeP_2O_8(OF)_{1-x}$, $ZrO_{2-x}$, $CeO_{2-x}$, $CaF_2$, and $BaF_2$, which materials reversibly donate/accept silver (Ag), copper (Cu), gold (Au), lithium (Li), sodium (Na), potassium (K), zinc (Zn), magnesium (Mg), other metal or metal-containing ions, hydrogen (H), oxygen (O), fluorine (F), and other halogen-containing ions.

In certain embodiments of the memory device fabricated according to the invention present invention, the at least one active layer and the at least one passive layer are each comprised of the same material, whereby the stack effectively comprises a single layer. The single layer comprises a composite material comprising a porous dielectric containing at least one polymer with variable conductivity. The porous dielectric is selected from the group consisting of Si, amorphous Si, silicon dioxide ($SiO_2$), aluminum oxide ($Al_2O_3$), copper oxide ($Cu_2O$), titanium dioxide ($TiO_2$), boron nitride (BN), vanadium oxide ($V_2O_3$), carbon trinitride ($CN_3$), and ferroelectric materials, including barium-strontium titanate ($(Ba,Sr)TiO_3$). The single layer stack may further comprise a barrier layer positioned within the stack interior and comprised of a material which impedes spontaneous movement of the charged species when an electrical potential difference is not applied between said first and said second electrodes.

In certain embodiments of the memory device fabricated according to the invention present invention, the stack effectively comprises a single layer containing at least one polymer with variable conductivity and which is doped with a charged species or electrolyte clusters.

Materials usable as the passive layer are characterized by the ease, i.e. rapidity, with which they donate and accept charged species, e.g., ions or ions+electrons, under the influence of a relatively weak electric field, i.e., within the range of electric fields used in typical semiconductor devices such as flash memories. Thus, application of a first polarity electric field to a layer stack comprised of at least one active layer and at least one passive layer will draw charged species such as ions or ions+electrons, from the latter into the former, and application of a second, opposite polarity electric field will "pull" at least some of the ions or ions+electrons out of the former layer and return them to the latter layer. Further, the donation and acceptance of the charged species is reversible and can be modulated for extremely long time periods and for millions of cycles.

According to the invention, the performance of memory cells or devices is a function of the conductivity modulation characteristics of the polymeric material of the active layer. Thus, the ease with which charged species such as ions are reversibly donated to the active layer (i.e., doped therein) and withdrawn therefrom determines the ease with which "programming" and "erasing" of the memory device occurs. Since this feature necessitates facile movement of the charged species, e.g., ions or ions+electrons, into and out from the active layer, the ions or ions+electrons will travel freely in the polymeric material, and thus have a tendency to return to their initial state or location under the influence of internal electrical fields (as during absence of the externally applied electrical field). Therefore, according to the invention, in order to improve the data retention characteristics of the memory devices, the interval during which relaxation occurs is controlled, i.e., the interval when the previously injected mobile ions or ions+electrons are partially displaced or move out of the active layer and return to the passive layer and the conductivity therefore decreases, is controlled. Such control may, for example, be achieved by providing at least one barrier layer for impeding motion of the charged species in the absence of an applied electrical field. Therefore, for a material to be useful as a barrier layer, it must have the property of not permitting easy travel therethrough of charged species such as ions or ions+ electrons, or a property of not attracting, or even repelling, ions or ions+electrons. Thus, the barrier layer limits spontaneous movement of the charged species (i.e., movement in the absence of an externally applied electric field) between the active layer and the passive layer, thereby increasing the data retention time of the memory device. Suitable materials for use as the barrier layer according to the invention include of $SiO_x$, $AlO_x$, $NbO_x$, $TiO_x$, $CrO_x$, $VO_x$, $TaO_x$, $CuO_x$, $MgO_x$, $WO_x$, $AlN_x$, Al, Pt, Nb, Be, Zn, Ti, W, Fe, Ni, and Pd.

According to the invention, a layer stack is formed which comprises at least one active layer and at least one passive layer, and optionally including at least one barrier layer. The layer stack is sandwiched between a pair of electrically conductive electrodes which serve as electrical connections for supplying the requisite externally applied electrical fields. Suitable electrically conductive materials for use as electrodes include metals, metal alloys, metal nitrides, oxides, sulfides, carbon, and polymers, including for example: aluminum (Al), silver (Ag), copper (Cu), titanium (Ti), tungsten (W), their alloys and nitrides, amorphous carbon, transparent oxides, including indium-tin-oxide (ITO), transparent sulfides, and organic polymers. The work functions of the particular materials utilized for the electrodes determines the ease with which electrons and/or holes are injected into the device under the influence of the applied electric field, and in turn, affects the memory function of the device, i.e., the speed at which the device can be programmed, read, and erased, as well as the amount of electrical power required to perform these functions. In addition, one of the electrodes may, in some instances, serve as a reactant material for forming the passive layer of the device.

Referring now to FIGS. 1(A)–1(B), shown therein, in schematic, partially cut-away perspective view, is an example of a two-layer memory device 10 according to the invention for illustrating the principle of conductivity modulation. As illustrated, memory device 10 comprises an upper electrode 1 and a lower electrode 2 with a layer stack interposed therebetween, comprised of an upper, active layer 3 (bounded on opposite vertically extending sides by encapsulation layer 9) in contact with upper electrode 1 and a lower, passive layer 5 in contact with lower electrode 2. Passive layer 5 is a source (i.e., donor) and acceptor of a charged species, illustratively positively charged ions 6 (typically metal ions) and active layer 3 is a poorly electrically conducting material (e.g., an insulator) including a plurality of micro-channels or pores 7 extending generally vertically between passive layer 5 and upper electrode 1 for facilitating injection and transport of ions 6 in the active layer 3. Thus, FIG. 1(A) illustrates the condition of memory device 10 when in the high resistance, low conductivity "off" state, i.e., no applied electric field, with ions 6 essentially confined to passive layer 5 and the micro-channels or pores 7 substantially devoid of ions 6; whereas FIG. 1(B) illustrates the condition of memory device 10 when in the low resistance, high conductivity "on" state, i.e., after application of an electric field of polarity and strength sufficient to cause ions 6 from the passive layer 5 to be injected (donated) into the micro-channels or pores 7 of the active layer 3 to form electrically conductive "nano-wires" 8. (In this regard, it should be noted that some ions 6 may be present within micro-channels or pores 7 when device 10 is in the "off" state; however, the amount of ions is insufficient to establish electrically conductive "nano-wires" 8).

Adverting to FIG. 2, shown therein is a current (I)-voltage (V) plot for illustrating operation of memory devices according to the invention. Starting at the origin of the plot (i.e., V and I=0), the voltage (V) applied to a device in the "off" (insulating, high resistance, or low conductivity) state is initially increased along curve 1. When the applied voltage reaches the programming threshold voltage $V_T$, typically in the range 0.5–4 V, the device quickly switches from the high resistance "off" state along curve 2. During programming, ions from the passive layer are mobilized by the applied electric field, injected into the active layer, and arranged into conductive micro-channels (as shown in FIG. 1(B)). The sharp decrease in resistance corresponds to the point at which formation of the electrically conductive micro-channels is complete, thereby providing a low resistance.

The memory device can be read at any voltage below the threshold voltage $V_T$, i.e., the "read region". Thus, a low voltage may be utilized to probe the device and check its resistance, wherein a low current indicates the device is in the high resistance, "off" state, and a high current indicates the device is in the low resistance, "on" state. The "read" operation is non-destructive and does not disturb the state of the device.

From the low resistance state, the applied voltage may be reduced towards 0 V along curve 3. The slope of the I–V curve indicates the memory device is in the low resistance state, since the steeper the slope of the I–V curve, the lower the resistance. The difference between the "on" and "off" states is termed the "on/off ratio", which may be as high as 9 orders of magnitude for the inventive devices, i.e., from several M to ~100–200, but typically is ~4–6 orders of magnitude.

With the device in the low resistance "on" state, erase may be performed by applying an increasingly negative voltage (along curve 3) until the erase threshold voltage $V_E$ is reached, at which point the device rapidly switches back to the high resistance "off" state along curve 4. Erase threshold voltages $V_E$ are typically in the same range as programming threshold voltages $V_T$, but can be tuned depending upon the choice of materials for the active and passive layers, electrodes, and layer thicknesses. In conceptual terms, an erase operation corresponds to the removal of a minimum amount of charged species, e.g., ions from the micro-channels or pores sufficient to interrupt continuity of the conductive nano-wires. As a consequence, only a small number of ions needs to be removed from the micro-channels or pores to effectively sever the conductive wire and thereby increase the resistance.

Figure 3:
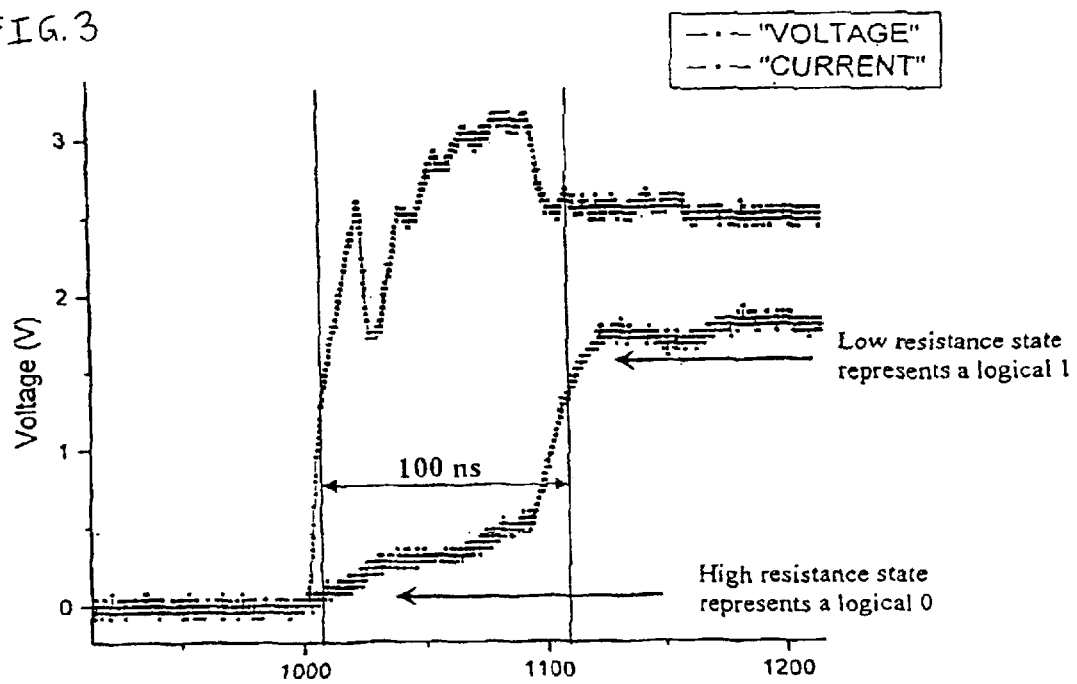
FIG. 3 is a plot of voltage (V) and current (I) vs. time (in nsec.) during switching of memory devices according to the invention from a high resistance "off" state (corresponding to a logical 0) to a low resistance "on" state (corresponding to a logical 1)

Referring to FIG. 3, which is a plot of voltage (V) and current (I) vs. time (in nsec.) during switching of memory devices according to the invention from a high resistance "off" state (corresponding to a logical 0) to a low resistance "on" state (corresponding to a logical 1), it is evident that switching times are very fast, i.e., on the order of about 100 nsec., indicating high operational speed.

A variety of device constructions comprising a layer stack between a pair of vertically spaced apart first and second electrodes are possible according to the invention, as illustrated in simplified, schematic cross-sectional view in FIGS. 4–11, wherein each of the various constituent layers is comprised of one or more of the above-described materials indicated as suitable for use as that constituent layer.

Figure 4:
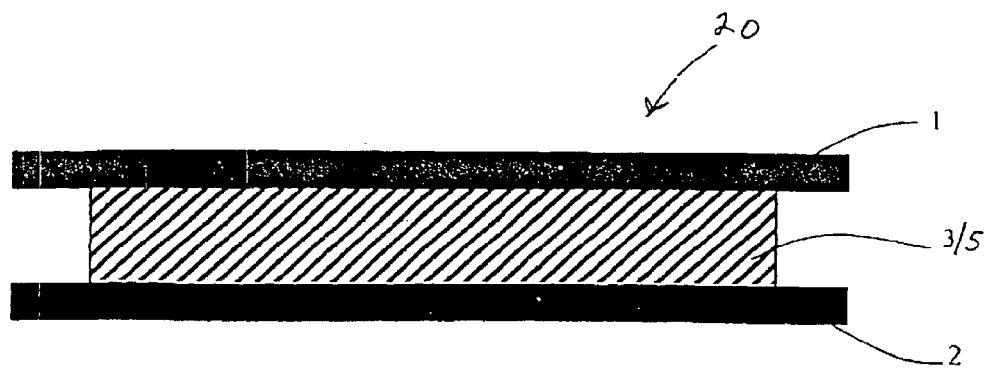
FIGS. 4–11 illustrate in simplified, schematic cross-sectional view, various memory device constructions according to the invention, each comprising a layer stack between a pair of vertically spaced apart first and second electrodes.
Figure 5:
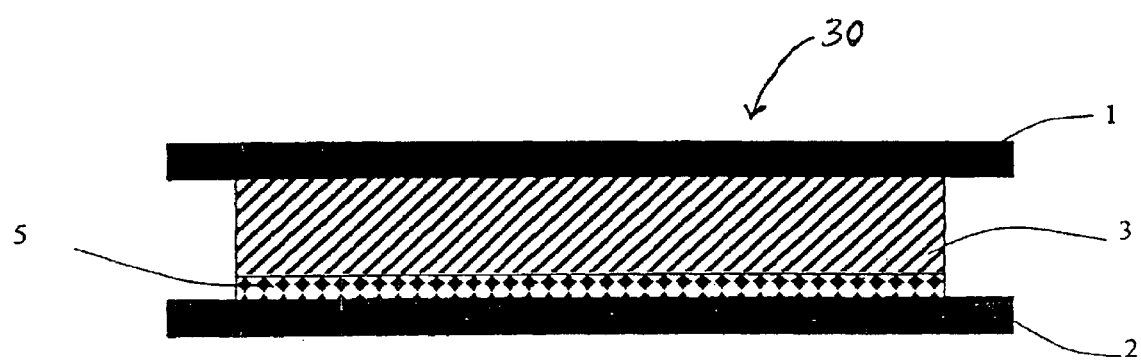
Figure 6:
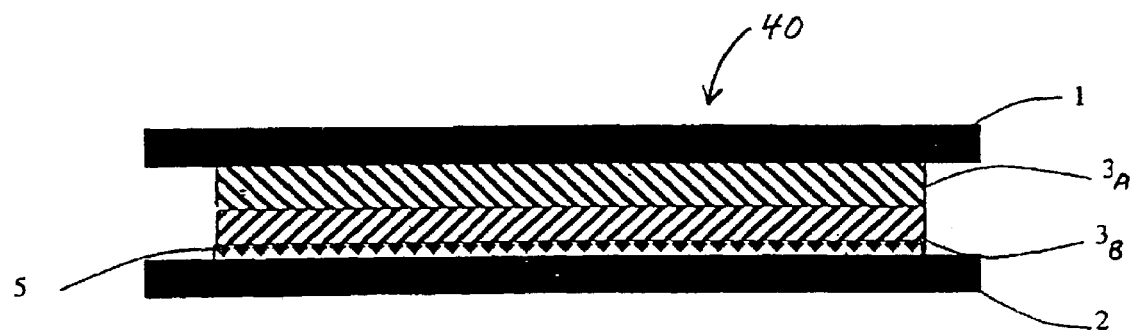
Figure 7:
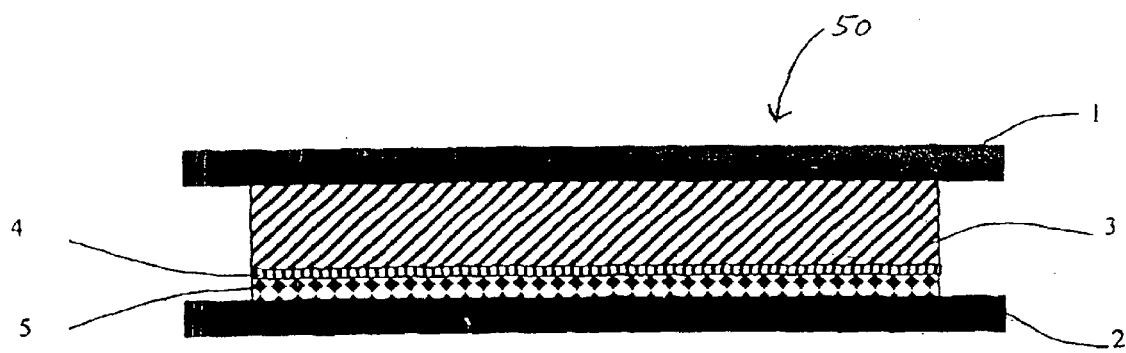
Figure 8:
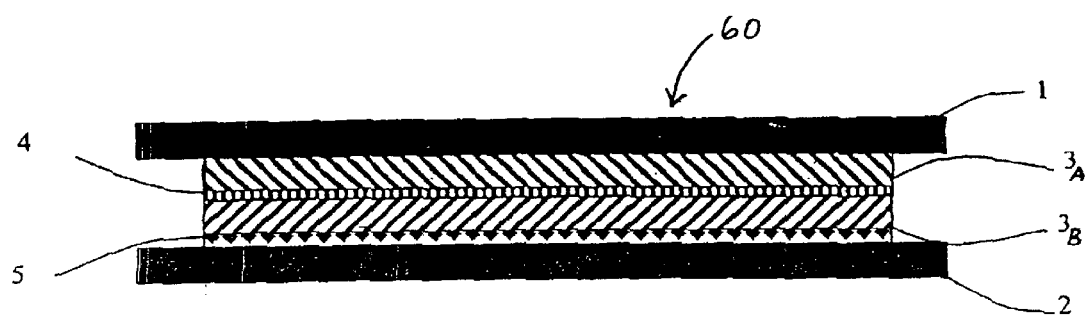
Figure 9:
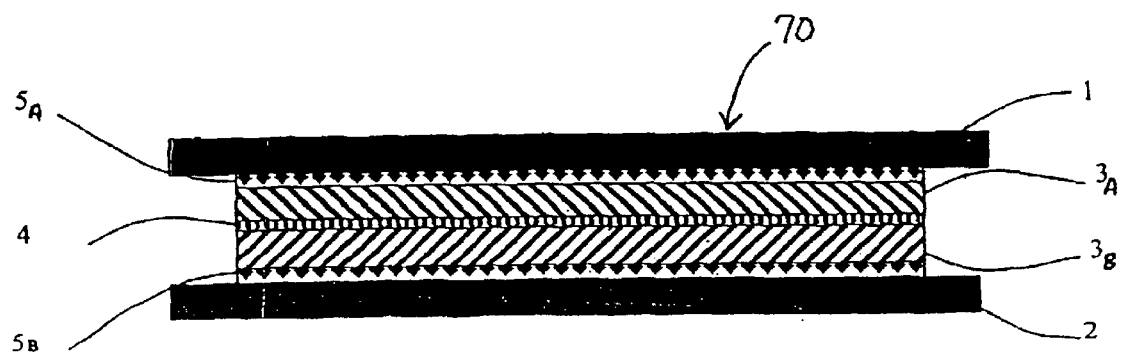
Figure 10:
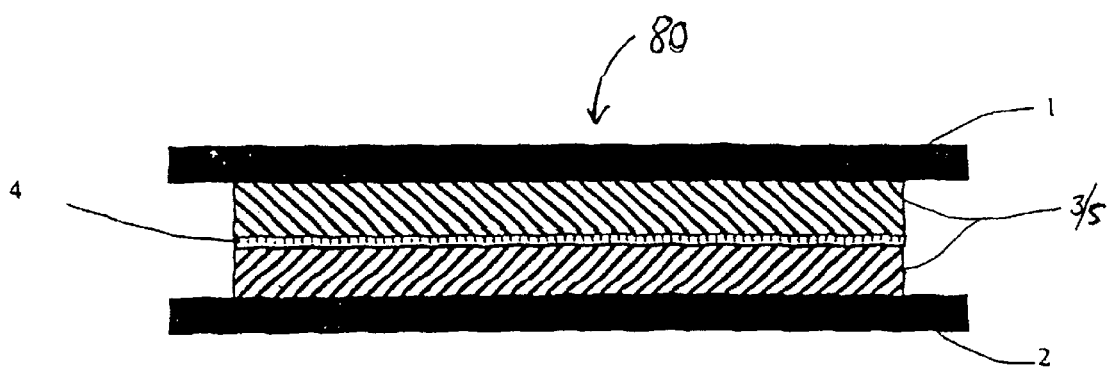
Figure 11:
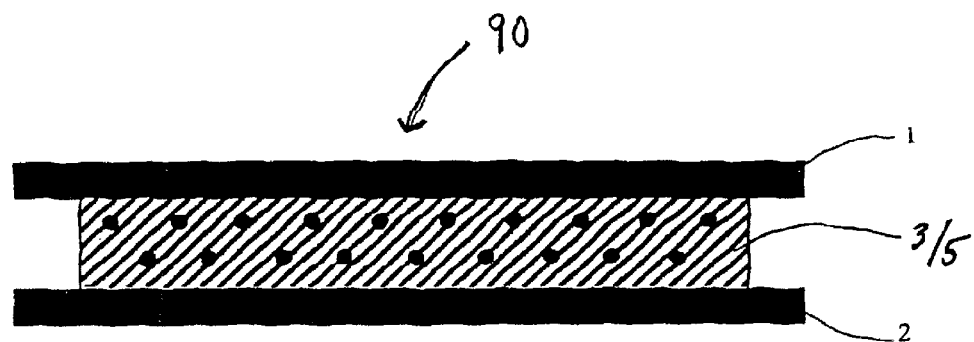

FIG. 4 shows a memory device 20 according to the invention, comprising a single layer sandwiched between a pair of electrodes, e.g., a composite active layer 3/5 comprised of a porous dielectric containing a polymeric material, sandwiched between upper and lower electrodes 1 and 2;

FIG. 5 shows a memory device 30 according to the invention, comprising a layer stack sandwiched between upper and lower electrodes 1 and 2, the layer stack including an upper, active layer 3 and a lower, passive layer 5;

FIG. 6 shows a memory device 40 according to the invention, comprising a layer stack sandwiched between upper and lower electrodes 1 and 2, the layer stack including a pair of active layers 3 including a first, upper active layer $3_A$ and a second, lower active layer $3_B$, and a lower, passive layer 5;

FIG. 7 shows a memory device 50 according to the invention, comprising a layer stack sandwiched between upper and lower electrodes 1 and 2, the layer stack including an upper, active layer 3 and a lower, passive layer 5, with a barrier layer 4 inserted between the upper, active layer 3 and the lower, passive layer 5;

FIG. 8 shows a memory device 60 according to the invention, comprising a layer stack sandwiched between upper and lower electrodes 1 and 2, the layer stack including a pair of active layers 3 including a first, upper active layer $3_A$ and a second, lower active layer $3_B$, a barrier layer 4 inserted between the first, upper active layer $3_A$ and the second, lower active layer $3_B$, and a lower passive layer 5;

FIG. 9 shows a memory device 70 according to the invention, comprising a layer stack sandwiched between upper and lower electrodes 1 and 2, the layer stack including a first, upper passive layer $5_A$, a pair of active layers 3 including a first, upper active layer $3_A$ and a second, lower active layer $3_B$, a barrier layer 4 inserted between the first, upper active layer $3_A$ and the second, lower active layer $3_B$, and a second, lower passive layer $5_B$;

FIG. 10 shows a memory device 80 according to the invention, which is a variant of single layer embodiment of FIG. 4, with a barrier layer 4 positioned within the stack interior 3/5; and FIG. 11 shows a memory device 90 according to the invention, comprising a single layer sandwiched between a pair of electrodes, i.e., an active layer 3/5 comprised of a polymeric material doped with a charged species or electrolyte clusters sandwiched between upper and lower electrodes 1 and 2.

The thickness of each of the constituent layers of each of the embodiments illustrated in FIGS. 4–11 are as follows:

first and second electrically conductive electrodes 1 and 2: from about 1,000 to about 8,000 Å, with 3,000 to about 5,000 Å presently preferred;

active layer 3 or active layers $3_A$ and $3_B$: from about 50 to about 3,000 Å thick, with 500 to about 700 Å presently preferred;

passive layer 5 or passive layers $5_A$ and $5_B$: from about 20 to about 300 Å thick, with 100 to about 150 Å presently preferred; and barrier layer 4: from about 20 to about 300 Å thick, with 50 Å presently preferred.

Each of the constituent layers may be prepared according to conventional techniques and methodologies and, for brevity's sake, details are not provided, except as noted below and in examples 1–17 described below:

the electrodes are formed via conventional thin film deposition techniques, e.g., thermal evaporation, sputtering, e-beam evaporation, etc.;

the passive layer may be formed by conventional thin film deposition techniques such as thermal evaporation, CVD, spin coating, or by first depositing a layer of a metal ultimately included in the passive layer, e.g., by reacting an initially formed Cu layer with a S, Se, or Te-containing gas or liquid to form a layer of a reaction product, e.g., $Cu_2S$ or $Cu_2Se$ in contact with the Cu layer;

porous active layers, such as porous polymeric materials, may be formed according to well-known thin film deposition techniques, such as thermal evaporation, spin coating, CVD, etc. Preferable pore sizes are 10–100 Å, with 30 Å preferred.

According to embodiments of the present invention, the polymer(s) of the active layer(s), may first be deposited as a monomer precursor by way of chemical vapor deposition (CVD). An example of forming one active layer by said process includes: forming a polymeric film, such as a polydiphenylacetylene film, over the surface of a passive layer, from a diphenylacetylene monomer precursor. Similarly, an example of forming more than one active layer by said process includes: forming a polymeric film, such as a phthalocyanine film, on the surface of a first active layer, from a tetracyanobenzene monomer precursor.

EXAMPLE 1

Ti/$Li_xTiS_2$/poly(t-butyl)diphenylacetylene/Al or Ti or amorphous carbon (a-C) (as in FIG. 5)—A first or lower conductive conductor is deposited on an upper surface of an insulating layer. The first or lower conductor may be formed from materials selected from: aluminum, silver, copper, titanium, tungsten and their alloys and nitrides, conductive oxides, and amorphous carbon (a-C). The first or lower conductor layer is about 3000 Å–8000 Å thick, with 5000 Å presently preferred. The $Li_xTiS_2$ passive layer may be deposited by chemical vapor deposition (CVD). The passive layer is about 50 Å–300 Å thick, with 100 Å presently preferred. The intercalation of lithium ions in $TiS_2$ layer may be accomplished by means of a solution of n-butyllithium in hexane. The active layer is poly(t-butyl)diphenylacetylene, which may be deposited from solution by spin-coating. The active layer is about 300 Å–1000 Å thick, with 500 Å presently preferred. The second conductor layer is deposited on the upper surface of the poly(t-butyl)diphenylacetylene active layer, in a similar manner as first conductor. The second conductor layer is about 3000 Å–8000 Å thick, with 5000 Å presently preferred.

EXAMPLE 2

Ti/Polymer electrolyte+poly(t-butyl)diphenylacetylene/ a-C (as in FIG. 11)—A first or lower conductive conductor is deposited on upper surface of insulating layer. The first or lower conductor may be formed from titanium and is about 3000 Å–8000 Å thick, with 5000 Å presently preferred. The active layer is mixture of a polymer electrolyte containing poly(propylene oxide) with lithium salt ($LiClO_4$) and poly (t-butyl)diphenylacetylene, which may be deposited from solution by spin-coating. The active layer is about 300 Å–1000 Å thick, with 500 Å presently preferred. The second conductor layer is amorphous carbon, which can be deposited on the upper surface of the PhCCPh active layer by magnetron co-sputtering. The second conductor layer is about 1000 Å–5000 Å thick, with 3000 Å presently preferred.

EXAMPLE 3

Ti/$Cu_{2-x}$S/polydiphenylacetylene/a-C (as in FIG. 5)—A first or lower conductive conductor is deposited on an upper surface of an insulating layer. The first or lower conductor may be formed from titanium, and is about 3000 Å–8000 Å thick, with 5000 Å presently preferred. The passive layer is $Cu_{2-x}$S. The $Cu_{2-x}$S passive layer is deposited on the upper surface of the first or lower conductor. The copper layer is about 100 Å–300 Å thick, with 150 Å presently preferred. This layer is deposited in a chamber with $H_2S$ gas for 15 minutes at room temperature. $Cu_{2-x}$S is produced by the reaction between copper and $H_2S$ gas. The active layer is polydiphenylacetylene, which may be deposited by way of CVD. A polydiphenylacetylene film is formed on surface of $Cu_{2-x}$S at 125° C. from a diphenylacetylene monomer precursor. The active layer is about 300 Å–1000 Å thick, with 500 Å presently preferred. The second conductor layer is amorphous carbon which can be deposited on the upper surface of the polydiphenylacetylene active layer, by magnetron co-sputtering. The second conductor layer is about 1000 Å–5000 Å thick, with 3000 Å presently preferred.

EXAMPLE 4

Ti/$Ag_2S$/polydiphenylacetylene/a-C (as in FIG. 5)—The memory cell was made using $Ag_2S$ as the passive layer, which is deposited on the upper surface of the conductor layer. The passive layer is about 50 Å–300 Å thick, with 100 Å presently preferred. The $Ag_2S$ passive layer may be deposited by way of CVD or evaporation. The active layer is polydiphenylacetylene, which may be deposited by way of CVD.

EXAMPLE 5

Ti/$Li_xWO_3$/poly(t-butyl)diphenylacetylene/Al or Ti or a-C (as in FIG. 5)—The memory cell was made in the same manner as Example 1 except that a $Li_xWO_3$ passive layer is deposited on the upper surface of the first or lower conductor. The $Li_xWO_3$ passive layer may be deposited with the following process: The tungsten layer is deposited on the upper surface of the first or lower conductor. The tungsten layer is about 100 Å–300 Å thick, with 150 Å presently preferred. This layer was deposited in a chamber with $O_2$ gas for 20 minutes at 250° C. After the reaction between tungsten and the oxygen gas, $WO_3$ is produced. The intercalation of lithium ions in $WO_3$ layer may be accomplished by means of a solution of n-butyllithium in hexane. The passive layer is about 50 Å–300 Å thick, with 100 Å presently preferred.

EXAMPLE 6

Ti/W/$Cu_xWO_3$/poly(t-butyl)diphenylacetylene/Al or Ti or a-C (as in FIG. 7)—The memory cell was made using $Cu_xWO_3$ as the passive layer. The $Cu_xWO_3$ passive layer may be deposited with the following process: The tungsten layer is deposited on upper surface of the first or lower conductor, and is about 100 Å–300 Å thick, with 150 Å presently preferred. This layer was deposited in a chamber with $O_2$ gas for 20 minutes at 250° C. $WO_3$ is produced by the reaction between the tungsten and oxygen. Next, CuI was deposited on the $WO_3$ layer from solution, by spin-coating. After heating up to a 150° C. temperature, $Cu_xWO_3$ is produced. Poly(t-butyl)diphenylacetylene serves as the active layer.

EXAMPLE 7

Ti/W/$H_xWO_3$/polyaniline/Al or Ti or a-C or ITO (as in FIG. 7)——A first or lower conductive conductor is deposited on an upper surface of an insulating layer. The first or lower conductor may be formed from titanium and is about 3000 Å–8000 Å thick, with 5000 Å presently preferred. The $WO_3$ passive layer may be deposited by the following process: The tungsten layer is deposited on the upper surface of the first or lower conductor, and is about 100 Å–300 Å thick, with 150 Å presently preferred. Next, the tungsten layer was deposited in a chamber with $O_2$ gas for 20 minutes at 250° C. The active layer is polyaniline, which may be deposited from solution by spin-coating. The active layer is about 300 Å–1000 Å thick, with 500 Å presently preferred. The second conductor layer is amorphous carbon, which can be deposited on the upper surface of the polyaniline active layer by magnetron co-sputtering. The second conductor layer is about 1000 Å–5000 Å thick, with 3000 Å presently preferred. Tungsten (W) serves as the barrier layer.

EXAMPLE 8

Ti/polyaniline/Pd/polyaniline/a-C or Ti or ITO (as in FIG. 10)——A first or lower conductive conductor is deposited on an upper surface of an insulating layer. The first or lower conductor may be formed from titanium and is about 3000 Å–8000 Å thick, with 5000 Å presently preferred. The lower active layer is polyaniline, which may be deposited from solution by spin-coating and is about 300 Å–1000 Å thick, with 500 Å presently preferred. The barrier layer is palladium, which may be deposited by magnetron co-sputtering and is about 30 Å–100 Å thick with 50 Å presently preferred. The upper active layer is also polyaniline with a preferred thickness of 500 ÅA. The second conductor layer is amorphous carbon, which can be deposited on the upper surface of the second polyaniline active layer by magnetron co-sputtering. The second conductor layer is about 1000 Å–5000 Å thick, with 3000 Å presently preferred.

EXAMPLE 9

Ti/$Cu_{2-x}$S/$SiO_2$+polydiphenylacetylene/a-C or ITO (as in FIG. 5)—A first or lower conductive conductor is deposited on an upper surface of an insulating layer. The first or lower conductor may be formed from titanium and is about 3000 Å–8000 Å thick, with 5000 Å presently preferred. A passive layer is $Cu_{2-x}$S. The $Cu_{2-x}$S passive layer may be deposited by CVD. The active layer is a composite containing porous silicon oxide ($SiO_2$) and polydiphenylacetylene. The active layer may be deposited by using the following process: First, a film of porous silicon oxide is deposited on the upper surface of passive layer by way of CVD. Next, a film of polydiphenylacetylene is grown in the pores of the silicon oxide from a diphenylacetylene monomer precursor of at 125° C. The active layer is about 300 Å–1000 Å thick, with 500 Å presently preferred. The second conductor layer is amorphous carbon, which can be deposited on upper surface of active layer by magnetron co-sputtering. The second conductor layer is about 1000 Å–5000 Å thick, with 3000 Å presently preferred.

EXAMPLE 10

Ti/Cu$_{2-x}$S/porous ferroelectric+polydiphenylacetylene/a-C (as in FIG. 5)—The memory cell was made in the same manner as Example 9 except that active layer is composite of polydiphenylacetylene and porous (Ba,Sr)TiO$_3$ which can deposited by way of CVD. Cu$_{2-x}$S serves as the passive layer.

EXAMPLE 11

Ti/Cu$_{2-x}$S/polydiphenylacetylene/polyphthalocyanine/a-C (as in FIG. 6)—A first or lower conductive conductor is deposited on an upper surface of an insulating layer. The first or lower conductor may be formed from titanium and is about 3000 Å–8000 Å thick, with 5000 Å presently preferred. The lower active layer is polydiphenylacetylene, which may be deposited by CVD. A polydiphenylacetylene film is formed on the surface of the Cu$_{2-x}$S passive layer at 125° C. from a diphenylacetylene monomer precursor. The upper active layer is about 300 Å–1000 Å thick, with 500 Å presently preferred. The second active layer is polyphthalocyanine, having a preferred thickness of 150 Å. Polyphthalocyanine films are formed on surface of the polydiphenylacetylene at 125° C. from a tetracyanobenzene monomer precursor. The second conductor layer is amorphous carbon, which can be deposited on upper surface of second polyphthalocyanine active layer by magnetron co-sputtering. The second conductor layer is about 1000 Å–5000 Å thick, with 3000 Å presently preferred.

EXAMPLE 12

Ti/Cu$_{2-x}$S/polyphthalocyanine/a-C (as in FIG. 5)—The memory cell was made using polyphthalocyanine as the active layer, which may be deposited by CVD. A polyphthalocyanine film may be formed on the surface of the Cu$_{2-x}$S passive layer at 125° C., from a monomer of tetracyanobenzene. The active layer is about 500 Å–3000 Å thick, with 700 Å presently preferred. The second conductor layer is amorphous carbon, which can be deposited on the upper surface of the active layer by magnetron co-sputtering. The second conductor layer is about 1000 Å–5000 Å thick, with 3000 Å presently preferred.

EXAMPLE 13

Ti/W/H$_x$WO$_3$/SiO$_2$+polyaniline/Al or Ti or a-C or ITO (as in FIG. 7)—This cell was fabricated in a similar manner as Example 7, except that the active layer is a composite of containing porous silicon oxide (SiO$_2$) and polyaniline.

EXAMPLE 14

Ti/W/H$_x$Pd/SiO$_2$+polyaniline/Al or Ti or a-C or ITO (as in FIG. 7)—This cell was fabricated in a similar manner as Example 13, except that the passive layer is palladium, which is deposited by way of CVD or evaporation.

EXAMPLE 15

Ti/Cu$_{2-x}$S/Cu$_2$O+polydiphenylacetylene/a-C or ITO (as in FIG. 5)—This cell was fabricated in a similar manner as Example 9, except that the active layer is a composite of containing porous copper oxide (Cu$_2$O) and polydiphenylacetylene.

EXAMPLE 16

Ti/W/H$_x$WO$_3$/Porous ferroelectric+polyaniline/Al or Ti or a-C or ITO (as in FIG. 7)—This cell was fabricated in a similar manner as Example 13, except that the active layer is a composite of containing polyaniline and porous (Ba,Sr)TiO$_3$ which can deposited by way of CVD.

EXAMPLE 17

Ti/SiO$_2$+polyaniline/Pd/SiO$_2$+polyaniline/a-C or TI or ITO (as in FIG. 11)—This cell was fabricated in a similar manner as Example 8, except that each active layer is a composite containing porous silicon oxide (SiO$_2$) and polyaniline. The active layer is about 50Å–500Å thick, with 100 Å presently preferred.

EXAMPLE 18

Ti/Li$_x$WO$_3$/poly(ethylenedioxythiophene)+poly(styrene sulfonic acid)/Al or Ti or a-C or ITO (as in FIG. 7). This cell was fabricated in a similar manner as Example 5, except that each active layer is a composite containing poly (ethylenedioxythiophene) and poly(styrene sulfonic acid).

The above-described illustrative, but non-limitative examples of memory devices or cells fabricated according to the inventive concept and methodology reflect the extreme flexibility and versatility with regard to device structures and materials selection afforded by the present invention. Inasmuch as the read, write, and erase characteristics of the inventive devices are readily amenable to variation by means of appropriate selection of materials and layer thicknesses, the inventive devices are well suited for use in a variety of applications currently employing conventional semiconductor-based memory devices. Moreover, the inventive memory devices are readily fabricated in cost-effective manner utilizing conventional manufacturing technologies.

In the previous description, numerous specific details are set forth, such as specific materials, structures, reactants, processes, etc., in order to provide a better understanding of the present invention. However, the present invention can be practiced without resorting to the details specifically set forth. In other instances, well-known processing materials, structures, and techniques have not been described in detail in order not to unnecessarily obscure the present invention.

Only the preferred embodiments of the present invention and but a few examples of its versatility are shown and described in the present invention. It is to be understood that the present invention is capable of use in various other embodiments and is susceptible of changes and/or modifications within the scope of the inventive concept as expressed herein.

What is claimed is:

1. A reversibly programmable memory comprising at least one memory cell, the at least one memory cell comprising:
   a first conductive electrode layer;
   a passive layer formed over the first conductive electrode layer, the passive layer being a superionic material adapted to reversibly donate and accept charged species, the charged species including ions or ions and electrodes;
   an active layer formed over the passive layer, the active layer being an organic polymer that has a reversibly variable electrical conductivity upon the introduction and removal of charged species from the passive layer, the organic polymer having a relatively lower electrical conductivity when free of charged species and a relatively higher electrical conductivity when charged species are introduced; and
   a second conductive electrode layer formed over the active layer;

wherein the passive layer reversibly donates and accepts charged species to and from the active layer when an electrical potential difference is applied between the first conductive electrode layer and the second conductive electrode layer, and the first conductive electrode layer and the second conductive electrode layer are used to both program the memory cell to store information and read stored information from the memory cell.

2. The memory of claim 1, wherein the passive layer comprises the superionic material copper sulfide.

3. The memory of claim 1, wherein the first conductive electrode layer is made of copper.

4. The memory of claim 1, wherein the active layer comprises one of polyphenylacetylene and polydiphenylacetylene having said reversibly variable electrical conductivity.

5. The memory of claim 1, wherein:
the first conductive electrode layer is made of copper,
the passive layer comprises the superionic material copper sulfide, and
the active layer comprises one of polyphenylacetylene and polydiphenylacetylene having said reversibly variable electrical conductivity.

6. The memory of claim 1, further comprising:
a barrier layer including a material that impedes spontaneous movement of charged species between the active layer and the passive layer when an electrical potential difference is not applied between the first conductive electrode layer and the second conductive electrode layer.

7. The memory of claim 6, wherein the barrier layer is positioned between the active layer and the passive layer.

8. The memory of claim 1, wherein the active layer is about 50 to about 1000 Angstroms thick.

9. The memory of claim 1, wherein the passive layer is about 20 to about 100 Angstroms thick.

10. The memory of claim 1, wherein the memory cell includes only one active layer and only one passive layer between the first and second conductive electrode layers.

11. A reversibly programmable memory comprising at least one memory cell, the at least one memory cell comprising:
a first conductive electrode layer made of copper;
a passive layer formed over the first conductive electrode layer, the passive layer being a superionic material including copper sulfide adapted to reversibly donate and accept charged species, the charged species including ions or ions and electrons;
an active layer formed over the passive layer, the active layer being an organic polymer that has a reversibly variable electrical conductivity upon the introduction and removal of charged species from the passive layer, the organic polymer having a relatively lower electrical conductivity when free of charged species and a relatively higher electrical conductivity when charged species are introduced; and
a second conductive electrode layer formed over the active layer;
wherein the passive layer reversibly donates and accepts charged species to and from the active layer when an electrical potential difference is applied between the first conductive electrode layer and the second conductive electrode layer, and the first conductive electrode layer and the second conductive electrode layer are used to both program the memory cell to store information and read stored information from the memory cell.

12. A reversibly programmable memory comprising at least one memory cell, the at least one memory cell comprising:
a first conductive electrode layer;
a passive layer formed over the first conductive electrode layer, the passive layer being a superionic material including copper sulfide adapted to reversibly donate and accept charged species, the charged species including ions or ions and electrons;
an active layer formed over the passive layer, the active layer being an organic polymer that has a reversibly variable electrical conductivity upon the introduction and removal of charged species from the passive layer, the organic polymer having a relatively lower electrical conductivity when free of charged species and a relatively higher electrical conductivity when charged species are introduced; and
a second conductive electrode layer formed over the active layer;
wherein the passive layer reversibly donates and accepts charged species to and from the active layer when an electrical potential difference is applied between the first conductive electrode layer and the second conductive electrode layer, and the first conductive electrode layer and the second conductive electrode layer are used to both program the memory cell to store information and read stored information from the memory cell.

13. A reversibly programmable memory comprising at least one memory cell, the at least one memory cell comprising:
a first conductive electrode layer;
a passive layer formed over the first conductive electrode layer, the passive layer being a superionic material adapted to reversibly donate and accept charged species, the charged species including ions or ions and electrons;
an active layer formed over the passive layer, the active layer comprising polyphenylacetylene (PPA) or polydiphenylacetylene (PDPA) having a reversibly variable electrical conductivity upon the introduction and removal of charged species from the passive layer, the PPA or PDPA having a relatively lower electrical conductivity when free of charged species and a relatively higher electrical conductivity when charged species are introduced; and
a second conductive electrode layer formed over the active layer;
wherein the passive layer reversibly donates and accepts charged species to and from the active layer when an electrical potential difference is applied between the first conductive electrode layer and the second conductive electrode layer, and the first conductive electrode layer and the second conductive electrode layer are used to both program the memory cell to store information and read stored information from the memory cell.

14. A reversibly programmable memory comprising at least one memory cell, the at least one memory cell comprising:
a first conductive electrode layer made of copper;
a passive layer formed over the first conductive electrode layer, the passive layer being a superionic material including copper sulfide adapted to reversibly donate and accept charged species, the charged species including ions or ions and electrons;

an active layer formed over the passive layer, the active layer comprising polyphenylacetylene (PPA) or polydiphenylacetylene (PDPA) having a reversibly variable electrical conductivity upon the introduction and removal of charged species from the passive layer, the PPA or PDPA having a relatively lower electrical conductivity when free of charged species and a relatively higher electrical conductivity when charged species are introduced; and a second conductive electrode layer formed over the active layer;

wherein the passive layer reversibly donates and accepts charged species to and from the active layer when an electrical potential difference is applied between the first conductive electrode layer and the second conductive electrode layer, and the first conductive electrode layer and the second conductive electrode layer are used to both program the memory cell to store information and read stored information from the memory cell.

15. The memory of claim 11, wherein the active layer comprises polyphenylacetylene.

16. The memory of claim 11, wherein the active layer comprises polydiphenylacetylene.

17. The memory of claim 12, wherein the active layer comprises polyphenylacetylene.

18. The memory of claim 12, wherein the active layer comprises polydiphenylacetylene.

19. The memory of claim 13, wherein the active layer comprises polyphenylacetylene.

20. The memory of claim 13, wherein the active layer comprises polydiphenylacetylene.

* * * * *